United States Patent
Cuylen

(10) Patent No.: US 6,833,798 B2
(45) Date of Patent: Dec. 21, 2004

(54) METHOD FOR CODING A SEQUENCE OF DATA BYTES VIA AN AIR INTERFACE

(75) Inventor: Michael Cuylen, Zimdorf (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 10/722,500

(22) Filed: Nov. 28, 2003

(65) Prior Publication Data

US 2004/0155803 A1 Aug. 12, 2004

Related U.S. Application Data

(63) Continuation of application No. PCT/DE03/00854, filed on Mar. 17, 2003.

(30) Foreign Application Priority Data

Mar. 28, 2002 (DE) .......................................... 102 14 113

(51) Int. Cl.$^7$ ............................................... H03M 5/00
(52) U.S. Cl. ............................... 341/52; 341/58; 341/68
(58) Field of Search .............................. 341/52, 68, 59, 341/69, 70, 71, 72; 369/59.23

(56) References Cited

U.S. PATENT DOCUMENTS

| | | | | |
|---|---|---|---|---|
| 5,375,249 A | * | 12/1994 | Cho | .......................... 269/59.23 |
| 5,506,581 A | * | 4/1996 | Ino et al. | ....................... 341/58 |
| 5,748,119 A | | 5/1998 | Ko | |

FOREIGN PATENT DOCUMENTS

| | | |
|---|---|---|
| DE | 35 30 224 A1 | 5/1987 |
| WO | WO 01/43386 A1 | 6/2001 |

OTHER PUBLICATIONS

"Identification Cards—Contactless Integrated Circuit(s) Cards– Vicinity Cards– Part 2: Air Interface and Initialization", ISO/IEC 15693–2, ISO/IEC International Standard, May 1, 2000, pp. i–13.

"Identification Cards—Contactless Integrated Circuits(s) Cards– Proximity Cards– Part 2: Radio Frequency Power and Signal Interface", ISO/IEC 14443–2, ISO/IEC International Standard, Jul. 1, 2001, pp. i–11.

* cited by examiner

Primary Examiner—Jean Bruner Jeanglaude
(74) Attorney, Agent, or Firm—Sughrue Mion, PLLC

(57) ABSTRACT

A method and associated structures for coding a sequence of data bytes (BY1,BY2), in which two bits (B1, B2) of a data byte form a double bit (D1–D4). Each double bit is represented by a time slot frame (ZR1–ZR4) that has at least four time slots (ZS1–ZS4). The time slots can assume an on or off value (Z1, Z0). The coding is carried out in a time slot frame such that at least one time slot is preloaded with an off value (Z0) at a position (AF). The time slots that have not been preloaded have, at most, one time slot with an on-value in order to form a logic value (00, 01, 10, 11) of a double bit. The method can be used for identification systems (IS), for mobile data memories (DT) and for reader/writers (SLG). Therein, a higher data rate and/or a greater transmission distance between the reader/writer and the mobile data memory is achieved.

22 Claims, 2 Drawing Sheets

METHOD FOR CODING A SEQUENCE OF DATA BYTES VIA AN AIR INTERFACE

This is a Continuation of International Application PCT/DE03/00854, with an international filing date of Mar. 17, 2003, which was published under PCT Article 21(2) in German, and the disclosure of which is incorporated into this application by reference.

FIELD OF AND BACKGROUND OF THE INVENTION

The invention relates to the coding of a sequence of data bytes, in which two bits of a data byte form a double bit. Each double bit is represented by a time slot frame that has at least four time slots which can assume an on or off value. The invention also relates to a mobile data memory and a reader/writer for carrying out the method, as well as to an identification system having the reader/writer and having at least one mobile data memory.

Non-contacting identification systems operate on the basis of non-contacting transmission techniques. For example, these non-contacting transmission techniques may be based on electromagnetic principles, such as infrared or ultrasound transmissions. Such systems are used, for example, for identifying personnel or moving goods, such as transportation means. Therein, the necessary data is transmitted from a reader/writer to a mobile data memory and back via a non-contacting data transmission path, for example, via an air interface. The non-contacting identification system also allows for acquiring data when the mobile data memory moves by, for example.

In order to use the mobile data memories for an unlimited time, no energy stores, such as batteries, are integrated in the mobile data memories. The electrical power is obtained externally in a non-contacting manner, that is from an electrical or magnetic field that originates from the reader/writer. Therein, as the distance between the reader/writer and the mobile data memory decreases, an increasing amount of energy is drawn from the external field.

For a reader/writer to communicate with such mobile data memories, suitable transmission and coding methods are necessary, which ensure not only that the electronics in the mobile data memory are supplied with power, but also that radio requirements are complied with. Furthermore, in general, only specific frequency bands are allowed for transmitting data. For example, the ISM frequency bands (Industrial, Scientific & Medical) can be used for industrial, scientific and medical applications.

In accordance with, for example, ISO/IEC Standard 15693 Part 2 "Air Interface and Initialization" or ISO/IEC Standard 14443, these methods are known as time slot methods for operation in an ISM frequency band.

Methods of this type allow power to be continuously supplied to the data memory electronics. Therein, for the purpose of transmitting power, the carrier frequency, which is modulated with the data to be transmitted, is switched off only for a maximum time interval. Within this time interval, an energy store, which has previously been charged in the mobile data memory, needs to be able to bridge the power supply. Conversely, the data is transmitted from the mobile data memory to the reader/writer by means of loading modulation. In the process, the mobile data memory damps the inducing magnetic field in short intervals. In this loading phase, the mobile data memory requires the maximum power from the previously charged energy store. This loading phase must therefore be as short as possible, since the loading phase has a direct effect on the maximum possible distance between the reader/writer and the mobile data memory for rapid recharging purposes. In accordance with the above Standard, the loading modulation can be continuously carried out for one time slot as the maximum time interval. Alternatively, time slots can also be carrier-frequency-modulated with an auxiliary carrier, so that power can be transmitted within a modulated time slot. Thus, such modulated time slots can follow one another directly (in this context, see also FIG. 2).

In addition, the Standard defines, for a specific carrier frequency, the field strength limit values for the side bands caused by the modulation. The magnitude of the side band modulation is governed predominately by the time ratio and the number of changes from modulated time slots to unmodulated time slots. Therein, the restriction of the maximum permissible field strength in the respective frequency bands leads to a restriction of the maximum data rate for a previously defined, reliable operating distance. At the same time, this means that the maximum possible data rate decreases as the transmission distance between the reader/writer and the mobile data memory increases.

If, for example, in accordance with the above ISO/IEC Standard 14443 Type A, carrier frequency modulation with an auxiliary carrier and Manchester coding for a bit sequence of a data byte, which is to be transmitted, is chosen, then between 8 and 16 changes can occur between modulated and unmodulated time slots, depending on the bit sequence. This will be described in more detail with reference to FIG. 2 below.

This has the disadvantage that the large number of changes between modulated and unmodulated time slots leads to a high level of side band modulation. The resulting maximum possible data rate and/or the maximum possible transmission distance between the reader/writer and the mobile data memory are/is no longer sufficient for many applications.

OBJECTS OF THE INVENTION

It is one object of the present invention to provide a coding method that allows for a higher data rate for data transmission and/or a greater transmission distance between a reader/writer and a mobile data memory. Therein, power supply to the mobile data memory and compliance with the side band modulation limits are still ensured.

SUMMARY OF THE INVENTION

According to one formulation of the present invention, this and other objects are achieved by a method for coding a sequence of data bytes, in which two bits of a data byte form a double bit. Therein, each double bit is represented by a time slot frame that has at least four time slots. The time slots of the time slot frame can assume an on or off value. The coding is carried out in a time slot frame such that at least one time slot is preloaded or preoccupied with an off-value at a given position. The time slots that have not been preloaded have, at most, one time slot with an on-value in order to form a logic value of a double bit.

According to another formulation of the present invention, this and other objects are achieved by a mobile data memory and by a reader/writer for carrying out the method. Finally, in accordance with yet another formulation of the present invention, this and other objects are achieved by an identification system that has the reader/writer and at least one mobile data memory.

This has the advantage that the maximum data rate can be increased for the same operating distance between the reader/writer and the mobile data memory. Furthermore, for a predetermined data rate, the transmission distance between the reader/writer and the mobile data memory can be increased.

BRIEF DESCRIPTION OF THE DRAWINGS

The invention will be explained in more detail with reference to the following figures, in which.

DETAILED DESCRIPTION OF THE PREFERRED EMBODIMENTS

Figure 1:
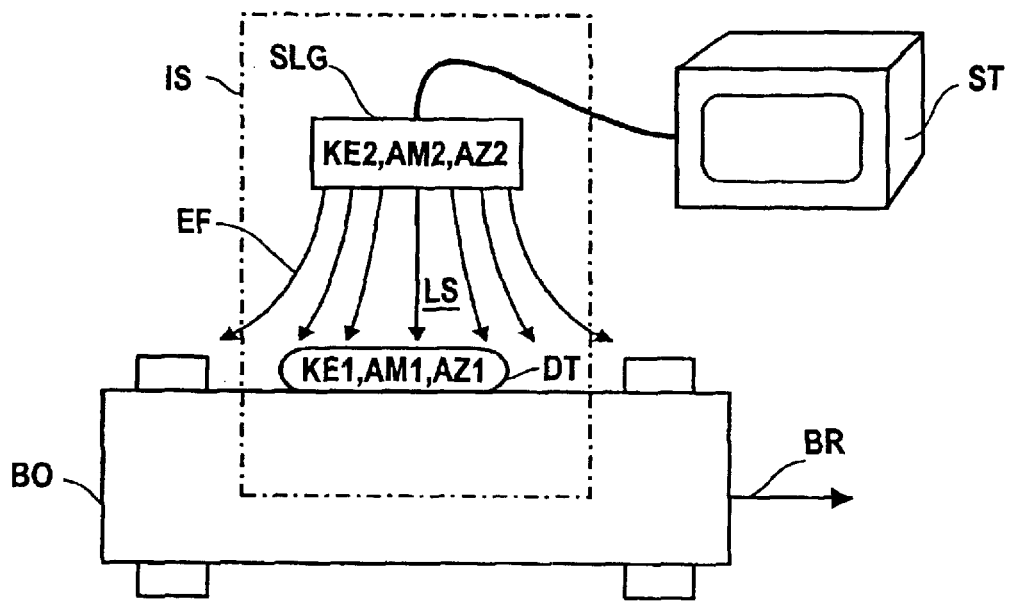
FIG. 1 shows an exemplary embodiment of an identification system, which has a reader/writer and a mobile data memory, each having a coding device for carrying out the method according to the invention for non-contacting interchange of data.

By way of example, FIG. 1 shows an identification system IS, which has a reader/writer SLG and a mobile data memory DT. The reader/writer SLG and the mobile data memory DT have a coding device KE1, KE2, respectively, for carrying out the method according to the invention. The mobile data memory DT is attached to a moving object BO, such as transportation means, which is moving in a movement direction BR relative to the reader/writer SLG In the exemplary embodiment shown in FIG. 1, data is transmitted via a non-contacting data transmission path LS, for example an air interface. The right-hand upper part of FIG. 1 shows, by way of example, a control computer ST, which is connected to the reader/writer SLG via an interface. Via this interface, data is interchanged between the control computer ST and the reader/writer SLG, for example for data acquisition purposes. Furthermore, the mobile data memory DT and the reader/writer SLG have, by way of example, checking units AM1, AM2 for deliberate interruption of a data transmission. AZ1, AZ2 denote calculated values, which are determined and temporarily stored by the respective coding device KE1, KE2 upon reception of the data.

Figure 2:
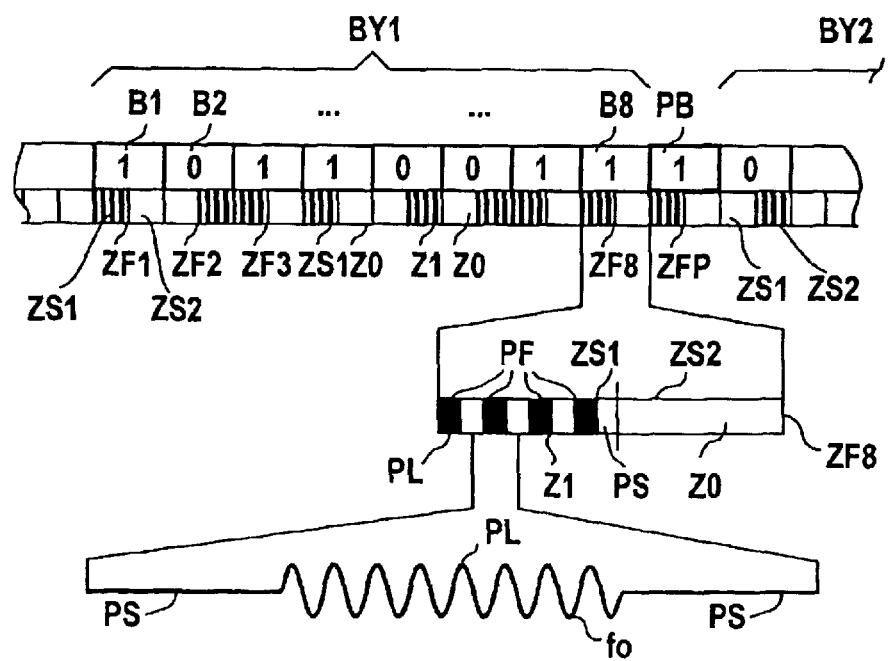
FIG. 2 shows an exemplary embodiment of a coding method for a data byte based on the ISO/IEC Standard 14443, using Manchester coding and using an auxiliary carrier in accordance with Type A of the above-mentioned Standard.

In addition, the mobile data memory DT is supplied with power via the air interface LS. Energy flow lines EF are shown in order to illustrate the energy flow from the reader/writer SLG to the mobile data memory DT. The energy may be carried by electrical or magnetic fields, for example. The energy may also be carried by infrared light, visible light or ultraviolet light transmitted from the reader/writer SLG Further exemplary energy carriers include microwaves, ultrasound waves or radio waves originating from the reader/writer SLG FIG. 2 shows an exemplary embodiment of a coding method for a data byte BY1,BY2 on the basis of ISO/IEC Standard 14443, by using Manchester coding and by using an auxiliary carrier in accordance with Type A of the above-mentioned Standard. The respective bits B1–B8 in a data byte BY1,BY2 are represented by one time slot block ZF1–ZF8, each of which includes two time slots ZS1, ZS2. Therein, a logic on-value 1 of a bit B1–B8 is represented by two successive time slots ZS1, ZS2 having an on-value Z1 and an off-value Z0. A logical off-value 0 of a bit B1–B8 is represented by two successive time slots ZS1, ZS2 with an off-value Z0 and an-on value Z1. In order to protect the data transmission, the eight bits B1–B8 in the data byte BY1 are followed by a parity bit PB, which is represented by a parity time slot block ZFP. Therein, the two time slots ZS1, ZS2 in the parity time slot block ZFP are coded in a corresponding manner.

The exemplary embodiment in FIG. 2 shows that twelve changes occur between modulated and unmodulated time slots in the coding of bit sequence 10110011 in the data byte BY1. As described above, these changes lead to a disadvantageous high level of side band modulation, which restricts the data rate and/or the transmission distance.

An enlarged time slot block ZF8 is shown in the lower area of FIG. 2. The modulated time slot ZS1, Z1 include a pulse sequence PF, which is formed from pulses PL and pauses PS. The pulses PL are formed from an integer number of sinusoidal carrier oscillations fo. During this pulse phase, a mobile data memory DT requires the maximum power for the load modulation, whereas, in the unmodulated pauses PS, the mobile data memory DT can be recharged with energy.

As can be seen in the exemplary embodiment of FIG. 2, the Manchester coding of the time slot blocks ZF2, ZF3, ZF6, ZF7 means that two time slots ZS1, ZS2 with an on-value Z1 can follow one another. This has the disadvantage that, in the case of continuous load modulation, a continuous supply of power to the data memory DT may no longer be ensured for the duration of a time slot ZS1–ZS2.

Figures 3, 4, 5:
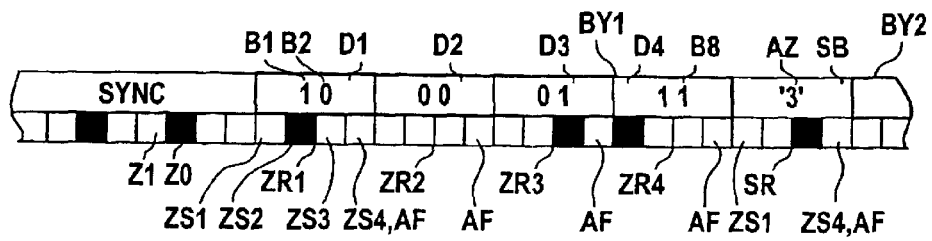
FIG. 3 shows an exemplary embodiment of a coding rule for coding a data byte into time slots of time slot frames according to the invention, wherein the time slots may assume an on value or an off value.
FIG. 4 shows an exemplary embodiment of a coding rule for a protection frame, which follows the time slot frame, for protecting data transmission of a data byte.
FIG. 5 shows a section of the coding of an exemplary data byte having a protection frame in the time slot level, in accordance with the invention.

FIG. 3 shows, in accordance with the invention, an exemplary embodiment of a coding rule for coding a data byte BY1,BY2 in time slots ZS1–ZS4 of time slot frames ZR1–ZR4, wherein the time slots ZS1–ZS4 may assume an on-value Z1 or an off-value Z0. By way of example, the left-hand part of FIG. 3 shows both the decimal representation DZ of a data byte BY1,BY2 for the numerical values 0, 1, 2, 3, 4 and 255, and the the corresponding binary representation B1–B8. The right-hand part of FIG. 3 shows an exemplary coding in the time slot frames ZR1–ZR4, each of which has, e.g., four time slots ZS1–ZS4.

According to the invention, two bits B1, B2 in a data byte BY1,BY2 form a respective double bit D1–D4, wherein each double bit D1–D4 is represented by a time slot frame ZR1–ZR4 that has at least four time slots ZS1–ZS4. The coding according to the invention is carried out in a time slot frame ZR1–ZR4 such that at least one time slot ZS4 is preloaded with an off-value Z0 at a position AF. The time slots ZS1–ZS3 that have not been preloaded have, at most, one time slot ZS1–ZS3 with an on-value Z1 in order to form a logic value 00, 01, 10, 11 for a double bit D1–D4. In the exemplary embodiment of FIG. 3, the coding of the data byte BY1,BY2 with the logic value 0 does not show any time slots with an on-value Z1, whereas the coding of the logic decimal value 255 has a maximum number of four time slots with an on-value Z1. In comparison to the solution based on the exemplary embodiment in FIG. 2, a maximum of four modulated time slots Z1 occur for the coding of the data byte BY1,BY2. At the same time, the number of changes between modulated and unmodulated time slots Z1,Z0 is limited to a value of eight. Furthermore, the coding according to the invention results in a time slot ZS1–ZS4 with an on-value Z1 being followed by at least one time slot ZS1–ZS4 with an off-value Z0.

This has the advantage that the side band modulation level can be reduced considerably in comparison to the solution shown in FIG. 2.

This has the further advantage that, for the same operating distance between the reader/writer SLG and the mobile data memory DT, the maximum data rate can be increased Furthermore, for a predetermined data rate, the transmission distance between the reader/writer SLG and the mobile data memory DT can be increased.

In addition, the coding according to the invention results in a time slot ZS1–ZS4 with an on-value Z1 being followed by at least one time slot ZS1–ZS4 with an off-value Z0.

This has the further advantage that, in comparison to the Manchester coding in the exemplary embodiment shown in FIG. 2, both modulation methods are possible in accordance with the above-mentioned standards, i.e., continuous load modulation and carrier frequency modulation by means of an auxiliary carrier.

Therein, according to the invention, a time slot ZS1–ZS4 with an on-value Z1 can be formed by a pulse sequence PF, in which case the pulse sequence PF may have an even number of pulses PL and pauses PS with the same duty ratio. Furthermore, a pulse PL may be associated with a predetermined number of carrier oscillations fo, as is shown in the exemplary embodiment of FIG. 2.

In accordance with the invention, FIG. 4 shows an exemplary embodiment of a coding rule for a protection frame SR, which follows the time slot frame ZR1–ZR4, in order to protect the data transmission of the data byte BY1,BY2. The protection frame SR has a number of time slots ZS1–ZS4 that corresponds to the previous time slot frames ZR1–ZR4. Therein, the expression "a corresponding number of time slots ZS1–ZS4" preferably means that the number of time slot frames ZR1–ZR4 is equal to the number of protection frames SR. In this case, at least one time slot ZS1–ZS4 in the protection frame SR is preloaded with an off-value Z0 at the corresponding position AF in the time slot frames ZR1–ZR4. The expression "corresponding" position AF means a time slot ZS1–ZS4, which is preferably in the same position AF both for the time slot frames ZR1–ZR4 and for the protection frame SR. In the exemplary embodiment shown in FIG. 4, the protection frame SR has four time slots ZS1–ZS4, with the time slot ZS4 being loaded with an off-value Z0 at the same position AF as in the exemplary embodiment of FIG. 3.

According to the invention, the coding in the protection frame SR is carried out such that a first number of on-values AZ from the time slot frames ZR1–ZR4 in the data byte BY1 is coded with a maximum of two non-successive on-values Z1 in those time slots ZS1–ZS4 in the protection frame SR that have not been preloaded. In the exemplary embodiment shown in FIG. 4, the respective values '0'–'4' for the number of on-values AZ are represented by a prime symbol. Referring to the exemplary embodiment in FIG. 3, the coding of the decimal number 255 has four time slots ZS1 with an on-value Z1.

This has the advantage that an on-value Z1, which is missing after the data transmission in a time slot frame ZR1–ZR4, or that a faulty loading in a time slot frame ZR1–ZR4, which was originally loaded only with off-values Z0, can be identified. This is done by comparing the number of on-values AZ coded in the protection frame SR with the actual number of on-values Z1 upon reception of the data.

Furthermore, in the exemplary embodiment of FIG. 4, the number of on-values AZ with the value '4' is coded by means of four time slots ZS1–ZS4 with an off-value Z0 in the protection frame SR. Therein, according to the invention, the time slots ZS1–ZS4 in the protection frame SR are loaded such that the deviation of all the on-value sum values SZ1 in the time slot frames ZR1–ZR4 of the data byte BY1 and in the protection frame SR is a minimum. For the example mentioned above, the on-value sum value SZ1 has a value 4.

In consequence, the differences between the respective on-value sum values SZ1 are as small as possible, so that this aresults in as uniform a number of changes as possible between modulated and unmodulated time slots, that is to say between on and off values Z1, Z0.

When the decimal value 0 in the data byte BY1,BY2 is coded in four time slot frames ZR1–ZR4 using exclusively off-values Z0, a protection frame SR follows with the time slot loading 1010. This leads to "synchronization" of the circuits that are involved in data reception, after the long sequence of off-values Z0.

According to the invention, FIG. 5 shows a section of the coding of an exemplary data byte with a protection frame on the time slot level. Therein, the data byte BY1 that is to be transmitted is formed from, e.g., four double bits D1–D4 with the logical values 00, 01, 10, 11. A respective double bit D1–D4 is represented by a time slot frame ZR–ZR4. Further, the double bits D1–D4 are followed by a protection block SB, wherein the value of the number of on-values is '3'. This value is represented by the protection frame SR by means of four time slots ZS1–ZS4 having the loading 0010.

According to the invention, the position AF in the preloaded time slot ZS1–ZS4 is located at the start or end of the time slot or protection frame ZR1–ZR4, SR. In the exemplary embodiment shown in FIG. 5, this is the last time slot ZS4 in a time slot frame or protection frame ZR1–ZR4.

This has the advantage that, upon reception, the correctness of the first time slots ZS1–ZS3 in a time slot or protection frame SR can be checked. In the event of an error, the subsequent unmodulated time slot ZS4 can then be modulated in order to indicate that an error has occurred.

FIG. 5 also shows a synchronization block SYNC, which precedes the coded time slot frame ZR1–ZR4 and which has repeated sequences of an on-value Z1 followed by two off-values Z0.

This advantageously results in a simple synchronization capability for the reception circuits in a reader/writer SLG or a mobile data memory DT.

It is a further advantage that the synchronization block SYNC can be unambiguously identified, since the above-mentioned repeated sequence cannot be coded in the four time slot frames and in the protection frame SR.

Furthermore, a mobile data memory DT can be used for non-contacting interchange of a sequence of data bytes BY1,BY2 with a reader/writer SLG. The mobile data memory DT has a first coding device KE1 for carrying out the method according to the invention. Upon reception of two successive time slots ZS1–ZS4 with an on-value Z1, the first coding device KE1 in the mobile data memory DT allows a time slot ZS1–ZS4 to be loaded with an on-value Z1 at a position AF. In accordance with the invention, the first coding device KE1 can also be used to determine a second number of on-values AZ1 from the time slot frames ZR1–ZR4 of a data byte BY1, and to compare this number with a first number of on-values AZ, which were previously coded in a protection frame SR. Thus, if the result is different, it is possible to load a time slot ZS1–ZS4 in the protection frame SR with an on-value Z1 at a position AF.

This has the advantage that incorrect transmission is signaled to the reader/writer SLG by means of the modulation Z1 of a time slot ZS1–ZS4.

In analogous manner, a reader/writer SLG can be used for non-contacting interchange of a sequence of data bytes BY1,BY2 with at least one mobile data memory DT. The reader/writer SLG has a second coding device KE2 for carrying out the method according to the invention. When two successive time slots ZS1–ZS4 with an on-value Z1 are received, the second coding device KE2 in the reader/writer SLG can be used to load a time slot ZS1–ZS4 at a position AF with an on-value Z1. The second coding device KE2 can also be used to determine a third number of on-values AZ2 from the time slot frames ZR1–ZR4 of a data byte BY1, and to compare this number with a first number of on-values AZ that were previously coded in a protection frame SR. Thus, if the result is different, a time slot ZS1–ZS4 in the protection frame SR can be loaded at a position AF with an on-value Z1.

This has the advantage that incorrect transmission is signaled to the mobile data memory DT by means of the modulation Z1 of a time slot ZS1–ZS4.

Furthermore, the mobile data memory DT may have a checking unit AM1, which, in accordance with the invention, interrupts the non-contacting interchange of a sequence of data bytes BY1,BY2 upon identification of an on-value Z1 at a position AF in a preloaded time slot ZS1–ZS4. After an interruption, the mobile data memory DT can then restart the non-contacting interchange according to the invention, at least beginning from that part of the sequence of data bytes BY1,BY2 which has not been interchanged.

Likewise, the reader/writer SLG may have a checking unit AM2, which, in accordance with the invention, interrupts the non-contacting interchange of a sequence of data bytes BY1,BY2 upon identification of an on-value Z1 at a position AF in a preloaded time slot ZS1–ZS4. After an interruption, the reader/writer SLG can then restart the non-contacting interchange according to the invention, at least beginning from that part of the sequence of data bytes BY1,BY2 which has not been interchanged.

Finally, the method according to the invention can be carried out by operating an identification system IS, which uses a modulation method based on ISO/IEC Standard 14443 or ISO/IEC Standard 15693 in an ISM frequency band, in particular in an ISM frequency band at 13.56 MHz. Furthermore, via a non-contacting data transmission path LS, the identification system IS can be used to interchange sequences of data D1–D4 between at least one reader/writer SLG and at least one mobile data memory DT.

This is particularly advantageous for an air interface LS that couples the reader/writer SLG and the mobile data memory DT in an inductive manner.

The above description of the preferred embodiments has been given by way of example. From the disclosure given, those skilled in the art will not only understand the present invention and its attendant advantages, but will also find apparent various changes and modifications to the structures and methods disclosed. It is sought, therefore, to cover all such changes and modifications as fall within the spirit and scope of the invention, as defined by the appended claims, and equivalents thereof.

What is claimed is:

1. A method for coding a sequence of data bytes, in which two bits of a data byte form a double bit, and in which each double bit is represented by a time slot frame that has at least four time slots which can assume an on or off value, wherein the coding in a time slot frame comprises preloading at least one time slot with an off-value at a specified position; and wherein the time slots that have not been preloaded have, at most, one time slot with an on-value in order to form a logic value of the double bit.

2. The method as claimed in claim 1, wherein a protection frame follows the time slot frame of the data byte;

wherein the protection frame has a number of time slots that corresponds to previous time slot frames;

wherein at least one time slot in the protection frame is preloaded with the off-value at the specified position in the time slot frames; and wherein coding in the protection frame is carried out such that a first on-value number from the time slot frames of the data byte is coded with, at most, two non-successive on-values in those time slots of the protection frame that have not been preloaded.

3. The method as claimed in claim 2, in which the time slots of the protection frame are loaded such that a deviation of all the on-value sum values in the time slot frame of the data byte and in the protection frame is at a minimum.

4. The method as claimed in claim 1, wherein the specified position of the preloaded time slot is located at the start or end of the time slot or protection frame.

5. The method as claimed in claim 1, wherein a time slot with an on-value is formed by a pulse sequence.

6. The method as claimed in claim 5, wherein the pulse sequence has an even number of pulses and pauses with a same duty ratio.

7. The method as claimed in claim 6, wherein a pulse has a predetermined number of carrier oscillations.

8. A mobile data memory for non-contacting interchange of a sequence of data bytes with a reader/writer, the mobile data memory comprising a first coding device configured to code a sequence of data bytes, in which two bits of a data byte form a double bit, and in which each double bit is represented by a time slot frame that has at least four time slots which can assume an on or off value, wherein the coding in a time slot frame comprises preloading at least one time slot with an off-value at a specified position; and wherein the time slots that have not been preloaded have, at most, one time slot with an on-value in order to form a logic value of the double bit.

9. The mobile data memory as claimed in claim 8, wherein, upon receiving two successive time slots with an on-value, the first coding device is configured to load the specified position of a time slot with an on-value.

10. The mobile data memory as claimed in claim 8, wherein the first coding device is configured to determine a second number of on-values from the time slot frames in the data byte;

wherein the first coding device is configured to compare the second number of on-values with a first number of on-values that was previously coded in a protection frame; and wherein, if the first number differs from the second number, the first coding device is configured to load an on-value at the specified position of a time slot in the protection frame.

11. The mobile data memory as claimed in claim 8, further comprising a checking unit configured to interrupt the non-contacting interchange of the sequence of the data bytes upon identification of an on-value at the specified position in a preloaded time slot.

12. The mobile data memory as claimed in claim 11, wherein, after an interruption, the mobile data memory is configured to restart the non-contacting interchange, at least beginning from that part of the sequence of the data bytes that had not been interchanged.

13. A reader/writer for non-contacting interchange of a sequence of data bytes with at least one mobile data memory, the reader/writer comprising a second coding device configured to code a sequence of data bytes, in which two bits of a data byte form a double bit, and in which each double bit is represented by a time slot frame that has at least four time slots which can assume an on or off value, wherein the coding in a time slot frame comprises preloading at least one time slot with an off-value at a specified position; and wherein the time slots that have not been preloaded have, at most, one time slot with an on-value in order to form a logic value of the double bit.

14. The reader/writer as claimed in claim 13, wherein, upon receiving two successive time slots with an on-value, the second coding device is configured to load the specified position of a time slot with an on-value.

15. The reader/writer as claimed in claim 13, wherein the second coding device is configured to determine a third number of on-values number from the time slot frames in the data byte;

wherein the second coding device is configured to compare the third number of on-values with a first number on values that was previously coded in a protection frame; and wherein, if the first number differs from the third number, the second coding device is configured to load an on-value at the specified position of a time slot in the protection frame.

16. The reader/writer as claimed in claim 13, further comprising a checking unit configured to interrupt the non-contacting interchange of the sequence of the data bytes upon identification of an on-value at the specified position in a preloaded time slot.

17. The reader/writer as claimed in claim 16, wherein, after an interruption, the reader/writer is configured to restart the non-contacting interchange, at least beginning from that part of the sequence of the data bytes that had not been interchanged.

18. An identification system, comprising:

at least one mobile data memory; and a reader/writer;

wherein the mobile data memory and the reader/writer interchange sequences of data via a non-contacting data transmission path;

wherein at least one of the mobile data memory and the read/writer comprises a coding device configured to code a sequence of data bytes, in which two bits of a data byte form a double bit, and in which each double bit is represented by a time slot frame that has at least four time slots which can assume an on or off value;

wherein the coding in a time slot frame comprises preloading at least one time slot with an off-value at a specified position; and wherein the time slots that have not been preloaded have, at most, one time slot with an on-value in order to form a logic value of the double bit.

19. The identification system as claimed in claim 18, wherein the identification system is configured to operate in an ISM frequency band on the basis of the ISO/IEC 1443 standard.

20. The identification system as claimed in claim 18, wherein the identification system is configured to operate in an ISM frequency band on the basis of the ISO/IEC 15693 standard.

21. The identification system as claimed in claim 19, wherein the ISM frequency band comprises a 13.56 MHz frequency band.

22. The identification system as claimed in claim 20, wherein the ISM frequency band comprises a 13.56 MHz frequency band.

* * * * *